US005482474A

United States Patent [19]
Yohn et al.

[11] Patent Number: 5,482,474
[45] Date of Patent: Jan. 9, 1996

[54] EDGE-MOUNTABLE CIRCUIT BOARD CONNECTOR

[75] Inventors: Brent D. Yohn, Newport; Dennis E. Smith, Elizabethtown, both of Pa.

[73] Assignee: The Whitaker Corporation, Wilmington, Del.

[21] Appl. No.: 245,174

[22] Filed: May 17, 1994

[51] Int. Cl.$^6$ .................................................. H01R 23/70
[52] U.S. Cl. .............................................. 439/79; 439/567
[58] Field of Search ................................. 439/65, 79, 80, 439/557, 558, 567, 571–573

[56] References Cited

U.S. PATENT DOCUMENTS

| | | | |
|---|---|---|---|
| 2,857,577 | 10/1958 | Vanderpool | 339/17 |
| 3,075,167 | 1/1963 | Kinkaid | 339/176 |
| 3,107,961 | 10/1963 | Hahn et al. | 339/17 |
| 4,253,719 | 3/1981 | McGinley | 339/61 M |
| 4,264,114 | 4/1981 | Chandler | 339/17 |
| 4,713,013 | 12/1987 | Regnier et al. | 439/62 |
| 4,715,820 | 12/1987 | Andrews, Jr. et al. | 439/59 |
| 4,967,262 | 10/1990 | Farnsworth | 357/80 |
| 5,234,353 | 8/1993 | Scholz et al. | 439/289 |

FOREIGN PATENT DOCUMENTS 342873  11/1989  European Pat. Off. ................. 439/79

Primary Examiner—Neil Abrams
Attorney, Agent, or Firm—Anton P. Ness

[57] ABSTRACT

Electrical connectors (1,2) attach to the top and bottom surfaces (22,23) of a circuit board (PCB) (3) and thereby form a sandwich connector (4) such as for board-to-board interconnection. The electrical connectors (1,2) include on their bottom surface (13) a fastener (14) and a recess (15). A first electrical connector (1) attaches to the top surface (22) of the PCB (3) by inserting its latching means (14) into a first aperture (18) of the PCB (3). The second electrical connector (2) attaches to the bottom surface (23) of the PCB (3) through a second aperture (19) of the PCB (3). The leading end of the fastener (14) of each connector (1,2) projects beyond a surface of a PCB (3) for latch (16) to latch, and is received in a recess (15) of the other connector (2,1). Surface mount leads (8) project from the front surface (7) of both connectors (1,2) and are soldered to pads (11,12) on the surfaces (22,23) of the PCB (3). Butting contact sections (10) project from the rear surface (9) of the connectors (1,2) to make contact with corresponding conductors of another electrical or electronic device. The recess (15) has an opening (20) allowing access to the fastener (14) to release the electrical connectors (1,2) from the PCB (3).

16 Claims, 6 Drawing Sheets

EDGE-MOUNTABLE CIRCUIT BOARD CONNECTOR

FIELD OF THE INVENTION

The invention herein disclosed deals with electrical connectors, and more specifically, the invention involves connectors for joining circuit boards to other electronic components such as other circuit boards.

BACKGROUND OF THE INVENTION

Printed circuit boards ("PCBs") are widely used in a broad range of products in commerce, examples of which are radios, televisions, VCRs, watches, timers and computers. The printed circuit boards come in a wide array of sizes and shapes.

Printed circuit boards, as well as other electronic components, in many instances are electronically joined through connectors. The components are typically interconnected to define a given function through a printed circuit board having contact pads complementary to pads of the components to which printed circuit board is to be joined.

Connectors are manufactured with distinct needs in mind. Some examples of special needs will be set forth below, with the invention herein described addressing some of these needs.

Connectors are manufactured with distinct requirements of contact force ranging from low closure force, to intermediate force, to those requiring rigorous application in the form of a coil spring. Special needs such as environment of use, vibration and stress must be kept in mind. Some special needs require that the connector be soldered to pads on the printed circuit board to insure that vibration or rough usage do not disrupt the connection.

In an effort to produce extremely high speed computers the size of the electronic devices used therein has become more miniaturized, so that now there is a need to provide a means to connect an extremely large number of contacts in a small space. Space considerations are of importance and it is generally desirable to engineer as many circuit boards as possible in a minimum amount of space.

The connectors can be formed, depending upon need, of materials such as stainless steel, beryllium, copper, phosphor bronze as well as various alloys thereof. On the contact points, finishes such as gold over nickel and finishes providing low resistance may be employed.

Recognizing the need to eliminate parts and components in electronic devices and the need to conserve space involved with printed circuit boards, as well as, the need to develop dependable connectors, efficiently, reliably and economically, the inventors have produced the connectors and the method of using the connectors of this invention.

PRIOR ART

Various connector designs are exemplified in U.S. patents.

U.S. Pat. No. 5,234,353 to Scholz et al is directed to an assembly of matable connectors having a plurality of signal contacts having a front contact surface which extend transversely of the connector's mating face to a free end. The patent to Scholz et al has an advantage in that the mating surfaces interface with low mating force allowing for long-term durability.

Chandler in U.S. Pat. No. 4,264,114 teaches an electrical connector assembly having an elongated main body with multiple rows of conductive leads. The Chandler device allows for the connection of two circuit boards within a connector. The connector is so fashioned as to be able to supply contact connections as well as support between the printed circuit board and the connector.

A connection system for printed circuit boards is described in U.S. Pat. No. 4,715,820 to Andrews et al. The disclosed connection system is designed to electrically interconnect circuits on a PCB mother board with PCB circuits on a daughter board. The boards are interconnected through a connector.

U.S. Pat. No. 3,107,961 to Hahn et al discloses a system for PCB connection wherein the connectors are fashioned so as to firmly secure the printed circuit board in the connector. The device disclosed by Hahn et al is designed to securely position the PCB into the connector. The device is designed to firmly secure the PCB taking into consideration variance of the thickness of PCBs, and does this by the use of a hinged connector which sandwiches and locks in place a PCB.

None of the printed circuit boards and joining connectors of the prior art show connection to both sides of the printed circuit board with a pair of symmetrical connectors.

SUMMARY OF THE INVENTION

The present invention has as an object the preparation of an improved edge-mountable connector for circuit boards.

Another object is to produce a connector which when employed will efficiently use and conserve board space on the PCB because both sides of the PCB are to be used.

A further object is to provide a connector which will produce reliable connections with the circuit board.

A still further object of the invention is to produce a PCB connector of simple, but efficient design, with the parts easy to assemble and easy to disassemble.

An important object of this invention is the elimination of the need to manufacture and to carry in inventory parts of different design. This object is accomplished by the use of two electrical connectors, one for the top surface and one for the bottom surface of the PCB, and which are identical.

The present invention relates to an edge mountable connector using electrical connectors for mounting on both sides of a circuit board, such as for board-to-board interconnection. In its broadest aspect the disclosed invention relates to an electrical connector comprising an elongated main body portion provided with a front surface, a rear surface and a bottom surface, with the rear surface defining half of the mating face of the ultimate connector assembly, and the bottom surface defining the mounting face. Conductive leads or contact members are carried transversely through said elongated main body portion forming electrical contacts, namely, surface mount leads projecting from said front surface; and butting contact sections, projecting from said rear surface.

The bottom surface of said elongated main body is provided at one end with a latching means or fastener and at the other end a recess. The recess is of such size and shape as to be able to receive that portion of a latching means which projects through an aperture and over the surface of a printed circuit board when a second electrical connector configured like the first is affixed to the opposite surface of the printed circuit board. The latching means or fastener may be a bifurcated cylindrical projection depending from the bottom surface through the board aperture and include a latch on one of the tines that latches onto the remote board surface with the tine preferably being accessible from the side of the connector for engagement such as by a simple tool to be deflected toward the other tine to permit insertion and withdrawal through the aperture while cooperating with the PCB aperture to align the surface mount leads with corresponding pads of the PCB. Preferably the projection is molded integrally to the body of the connector.

In a special embodiment of this invention the fastener has but a single tine which contains said latch and is deflectable to permit insertion and withdrawal of said projection from the aperture of the PCB.

The number of contact members carried by the main body portion is not critical. The number of contact members envisioned is at least one and should be the number of leads required to make contact with pads on the PCB to which the surface mount leads will be soldered. When a multiple number of leads are employed they can form a regularly spaced array and for example may be joined to a carrier strip defining a lead frame and then insert molded within the main body portion after which the carrier strip is removed, all of which facilitates handling and fabrication.

The circuit board employed in this invention is provided with contact pads for the top and bottom surfaces of the PCB proximate a selected edge, joined to circuit traces of the PCB. Along the selected edge of the PCB are two apertures running from the top surface to the bottom surface of the PCB near the surface pad arrays. The apertures at the edge of the printed circuit board are positioned at a distance which will allow each aperture to be opposite the latching means and recess of a respective electrical connector. This allows each electrical connector latching means to extend through a respective aperture to be received in an opposite electrical connector recess. The size and position of the apertures are such that the latching means will fit snugly therein. Thus, the electrical connector surface mount leads will be correctly positioned for soldering to PCB pads, and the butting contacts will be in a proper position for making contact when inserted into an electronic device.

In use, a first electrical connector (as above described) is affixed to a top surface of a printed circuit board (as above described) such that the latching means projects through a first aperture at the edge of the top surface of said PCB and latches onto the bottom surface of the PCB. A second electrical connector configured like the first electrical connector is inverted, reversed and affixed by its latching means to the bottom surface of the printed circuit board through a second aperture at the edge of the PCB. Each latching means projects over the top or bottom surface of the PCB and is received within a recess of its opposite affixed electrical connector.

Once the first and second electrical connectors are in place the surface mount leads can be soldered to surface pads or contacts on the PCB. With the soldering finished the board-to-board sandwich connector is ready for installation into an electronic device. The surface mount leads are resilient and can accommodate any unevenness of the PCB surface and assure proper contact. In final assembly contact sections extend from the rear surfaces of the elongated main body portions of both connectors and angularly surround the edge of the printed circuit board in an alternately staggered relationship (herein termed "butting contacts") and are disposed across the mating face of the connector assembly.

The electrical connector is unique in the design of the recess and in the design of the latching means.

The recess is designed with an opening which allows access to the latch on the latching means. If the connector has to be replaced, the latch is accessible through the opening in the recess and can be released for removal of the connector. The recess is also dimensioned so as to snugly retain the latching means. This snug fit aids in the positioning of the surface mount leads for soldering to the PCB pads.

The latching means has a special design. It is dimensioned so as to fit snugly into the aperture of the PCB and to also fit snugly into the recess. The latching means is supplied with a lengthwise split or bifurcation which allows for lateral flexibility to release the latch of the latching means. When the connector is to be removed from the PCB, the latch is forced in at the split, the latch is released and the connector can be lifted and removed. Of course, a latching means without a latch, and being held by friction could be designed; however, a friction fit may effect a less secure fit.

Because of the snug fit (close tolerance) between the recess, latching means and apertures, as set forth above, the surface mount leads will be accurately positioned for proper soldering to the PCB surface pads and the butting contacts will be in their proper position for making effective contact with corresponding conductors of another electrical article when inserted into the electronic device.

GENERAL DESCRIPTION OF THE PREFERRED EMBODIMENT

Figure 1:
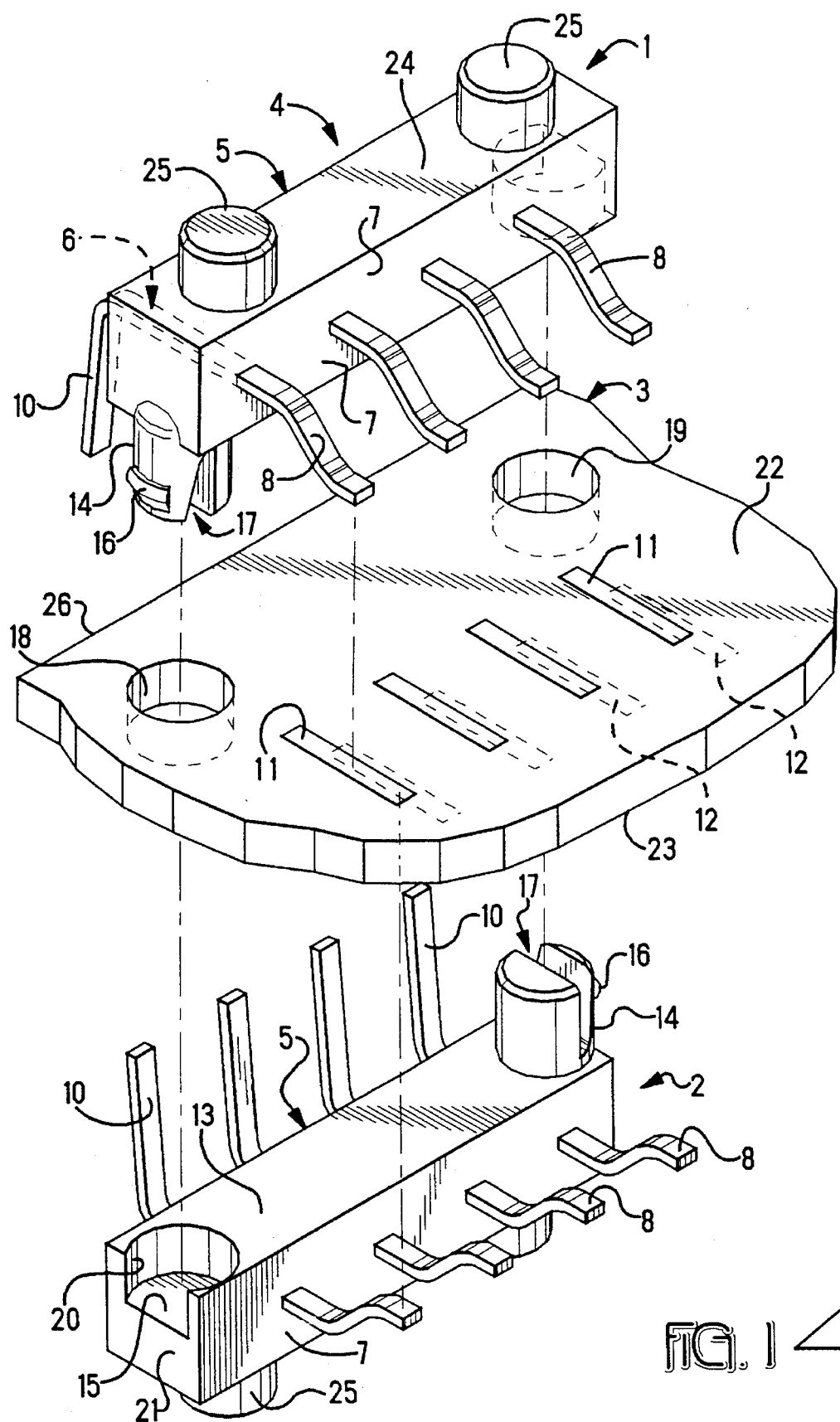
FIG. 1 is an exploded view of the board-to-board sandwich connector of this invention.
Figure 2:
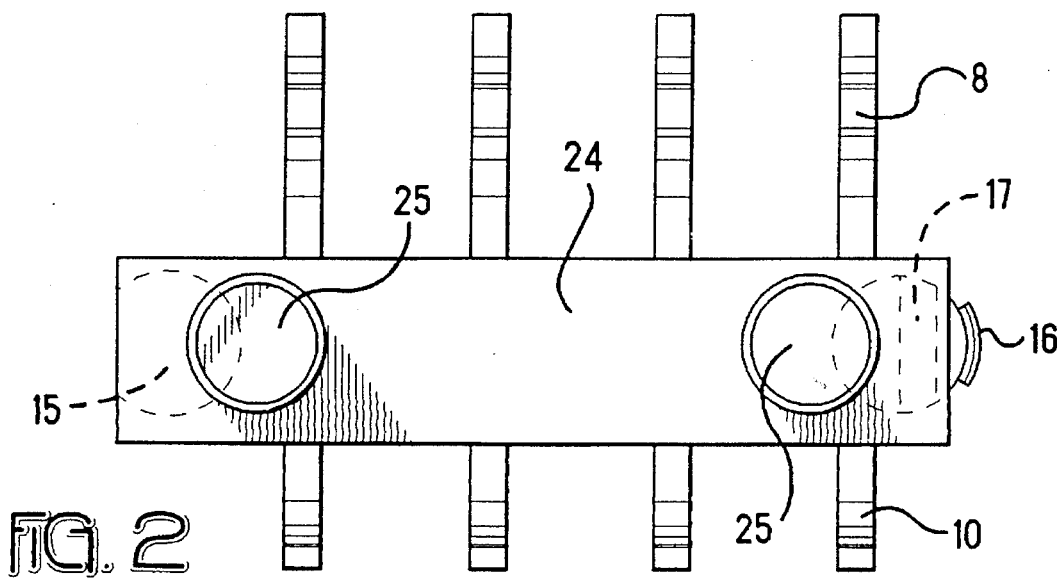
FIG. 2 is a top plan view of an electrical connector used in this invention.

With reference to FIG. 1 a top electrical connector 1 and a bottom electrical connector 2 sandwiches a printed circuit board 3 there between, and will form the board-to-board sandwich connector 4 of the present invention. Both the top and bottom electrical connectors 1, 2 are substantially identical and are simply properly oriented for mating to their respective surfaces of the printed circuit board 3.

Each connector 1, 2 has an elongated main body portion 5 having a plurality of conductive leads or contact members 6 molded therein. Each contact member 6 projects from the front surface 7 of the elongated main body portion 5 as a surface mount lead 8, and from the rear surface 9 as a butting contact section 10.

Figure 9:
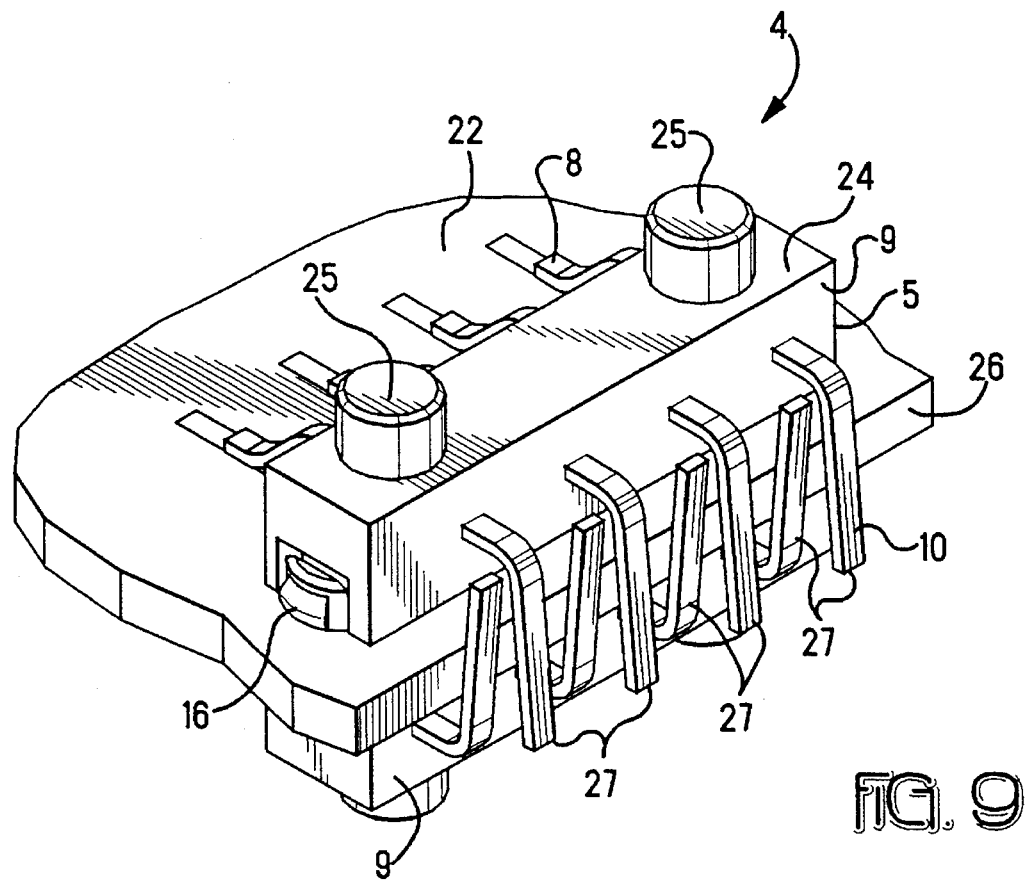
FIG. 9 is a perspective view illustrating the board-to-board sandwich connector showing the alternately staggered relationship of the butting contacts angularly surrounding the edge of the printed circuit board (only partially shown) comprising the connector mating face.

The surface mount leads 8 will be soldered to top and bottom pads 11, 12 on the PCB 3. The surface mount leads 8 are resilient and will accommodate any unevenness of the surface of the PCB 3 which might be brought about by, for example, warping of the printed circuit board. The butting contact sections 10 angularly project from the rear surface 9 of the elongated main body 5 of both the top and bottom connectors 1, 2 shown in greater detail in FIG. 9. The butting contact sections 10 in ultimate use will butt and make contact with mating contacts of an electronic device (not shown).

Figure 5:
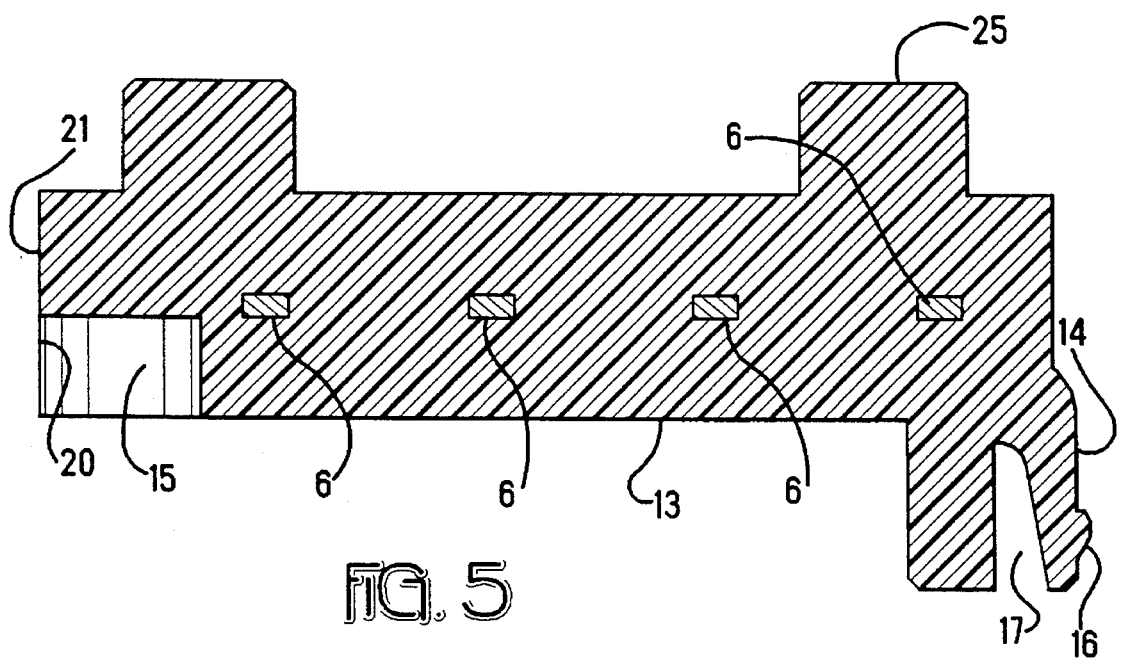
FIG. 5 is a cross-sectional view of a connector used in this invention taken along lines 5—5 of FIG. 4.

The bottom or board proximate surface 13 of each elongated main body portion 5 of electrical connectors 1, 2 has at one end a latching means or fastener, and at the other end a recess 15. The latching means or fastener is preferably defined by or on a projection 14 molded integrally to main body portion 5 and has a latch 16 and preferably a lengthwise slit 17 (FIGS. 1 and 5) which allows the latch 16 on the latching means 14 to be flexible and to flex allowing the latch 16 to pass by PCB aperture 18 or 19 and latch on to a surface of the PCB 3. To remove a connector 1 or 2 from a PCB 3 the latch 16 on the latching means 14 is forced in, with slit 17 in the latching means 14 yielding, allowing the latch 16 to pass-by aperture 18 or 19 and thus connector 1 or 2 is free to be removed. The recess 15 (FIGS. 1 and 5) has an opening 20 at an end 21 of the elongated main body 5. The recess 15 receives that portion of the latching means 14 which projects over the top surface 22 or bottom surface 23 of the PCB 3. The opening 20 in the recess 15 at the end of the end 21 of the elongated main body 5 allows for access to the latch 16 in the event the latching means 14 has to be released to remove a connector 1, 2 from the PCB 3. Optionally, fastener 14 may be a single deflectable arm so designed to position a latch section to engage the remote board surface when the deflectable arm resiles upon full insertion through the aperture; and the fastener may also be a separate board lock (not shown) affixed to main body portion 5 to depend from bottom surface 13.

On the top surface 24 of the elongated main body 5 are guides 25 which will aid in positioning the board-to-board sandwich connector 4 when installed into an electronic device (not shown).

Figure 6:
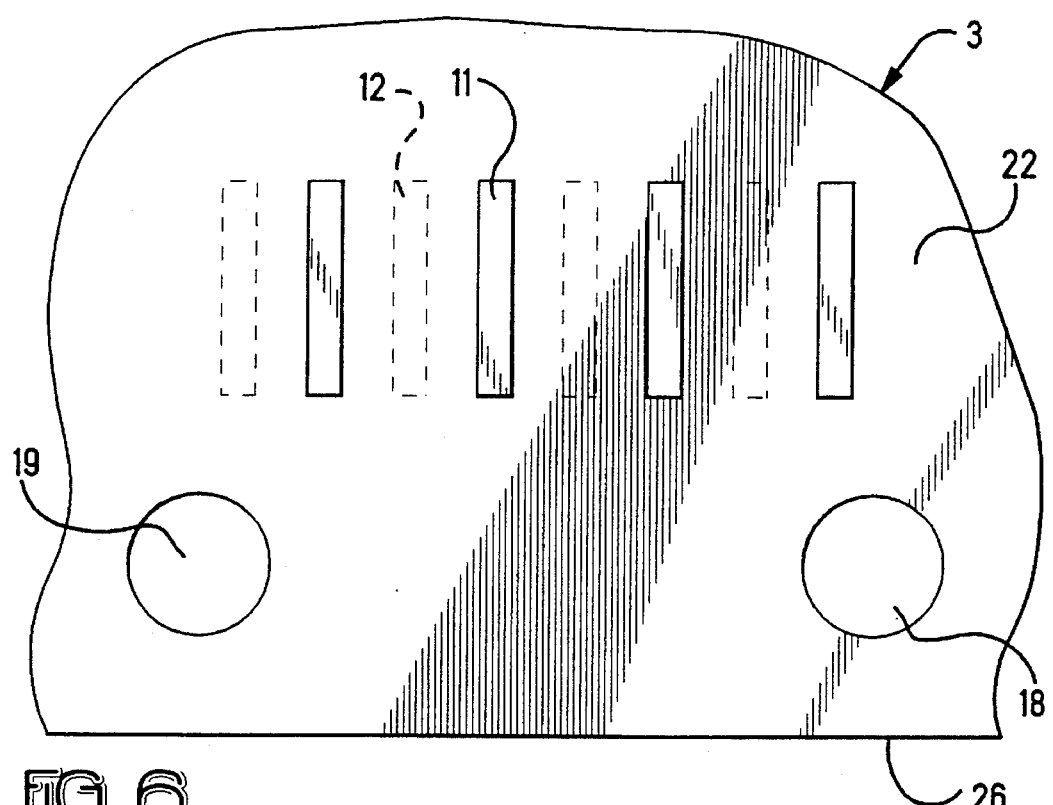
FIG. 6 is a partial top plan view of a printed circuit board that can be used with this invention.

The printed circuit board 3 has apertures 18, 19 and PCB pads 11, 12 referenced to apertures 18, 19 (FIGS. 1 and 6). The apertures 18, 19 of the printed circuit board 3 are of such a size as to snugly receive the projection 14. The distance between the apertures 18, 19 is such that, for example, one aperture 18 will receive the latching means and the other aperture 19 will be opposite the recess 15. The pads 11, 12 on the surfaces 22, 23 of the PCB 3 are in a staggered relationship and receive the surface mount leads 8 for soldering, which are referenced to latching means 14 and recess 15 of connectors 1,2. Preferably the leading ends of projections 14 include beveled edges facilitating initial receipt into PCB apertures 18,19.

The PCB apertures 18, 19, latching means 14 and recess 15 are all designed to fit snugly (to be of close tolerance) to ensure accurate positioning of the surface mount leads 8 for soldering to the PCB pads 11, 12 and to ensure that the butting contact sections 10 are positioned properly for insertion into an electronic device.

Figure 7:
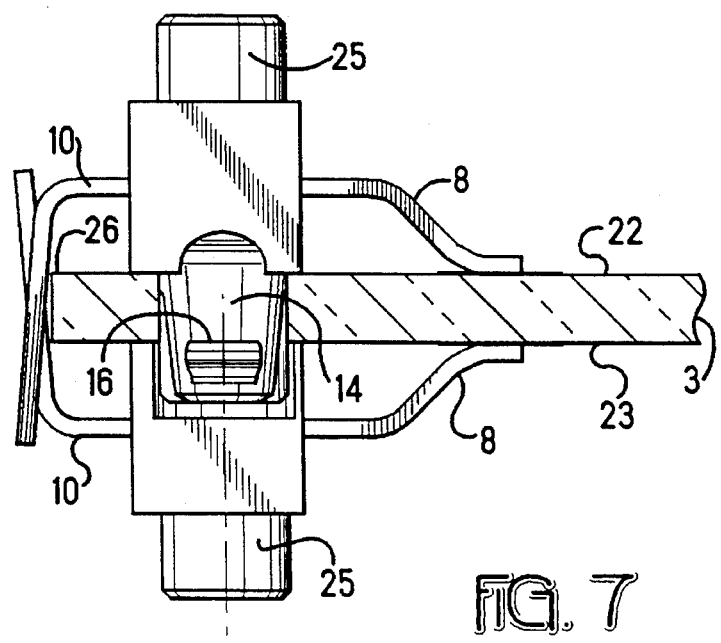
FIG. 7 is an end elevational view of the printed circuit board mated with top and bottom connectors. Part of the printed circuit board is cut-away to show detail of the latching means.
Figure 8:
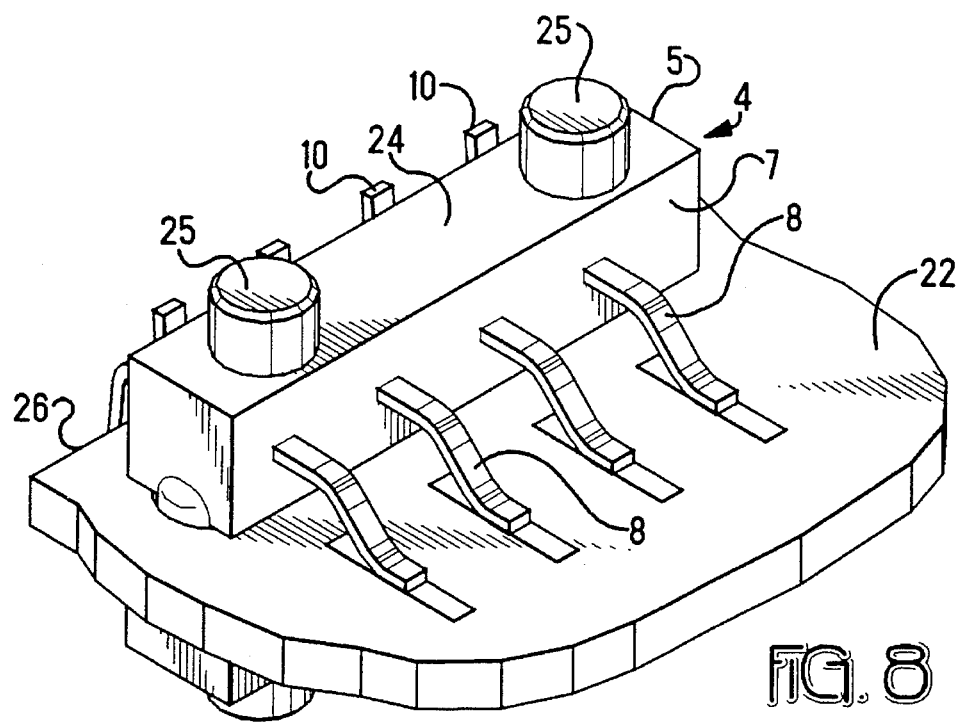
FIG. 8 is a perspective view illustrating the board-to-board sandwich connector, with the printed circuit board partially cut-away to show part of the connector on the under surface of the printed circuit board.

In final assembly (FIGS. 7–9) the connectors 1 and 2 sandwich the PCB 3. The surface mount leads 8 are soldered to the PCB pads 11 and 12. The butting contact sections 10 project from the rear surface 9 of the elongated main body 5 and angularly surround the edge 26 of the PCB 3 in an alternately staggered relationship 27. Once completely assembled the board-to-board sandwich connector can be installed into an electronic device.

Figure 3:
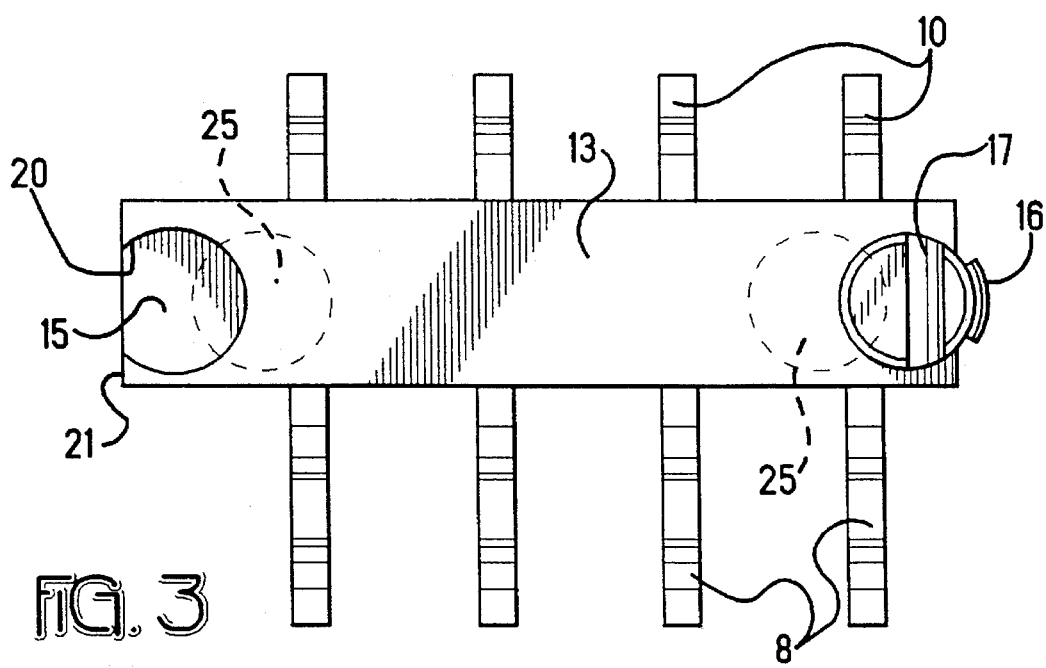
FIG. 3 is a bottom plan view thereof.
Figure 4:
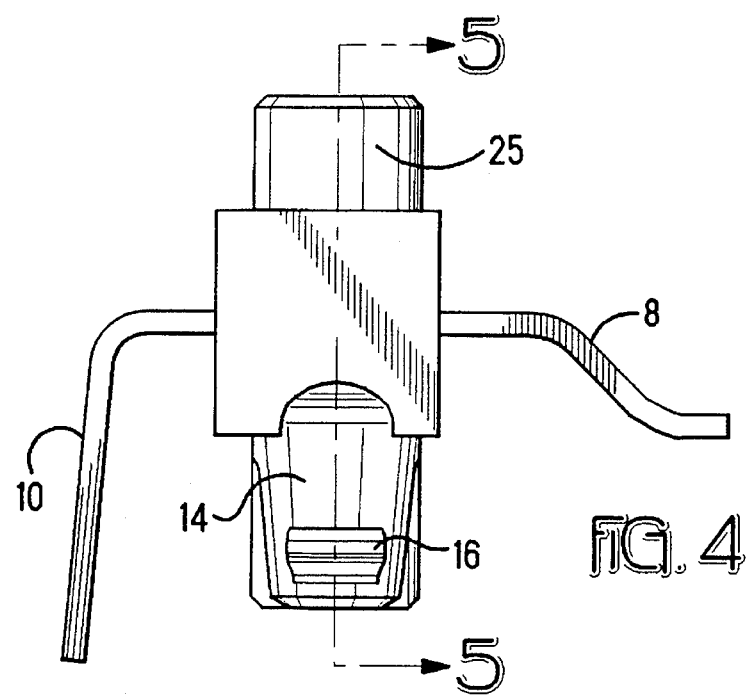
FIG. 4 is a latch-end elevational view of an electrical connector.
Figure 10:
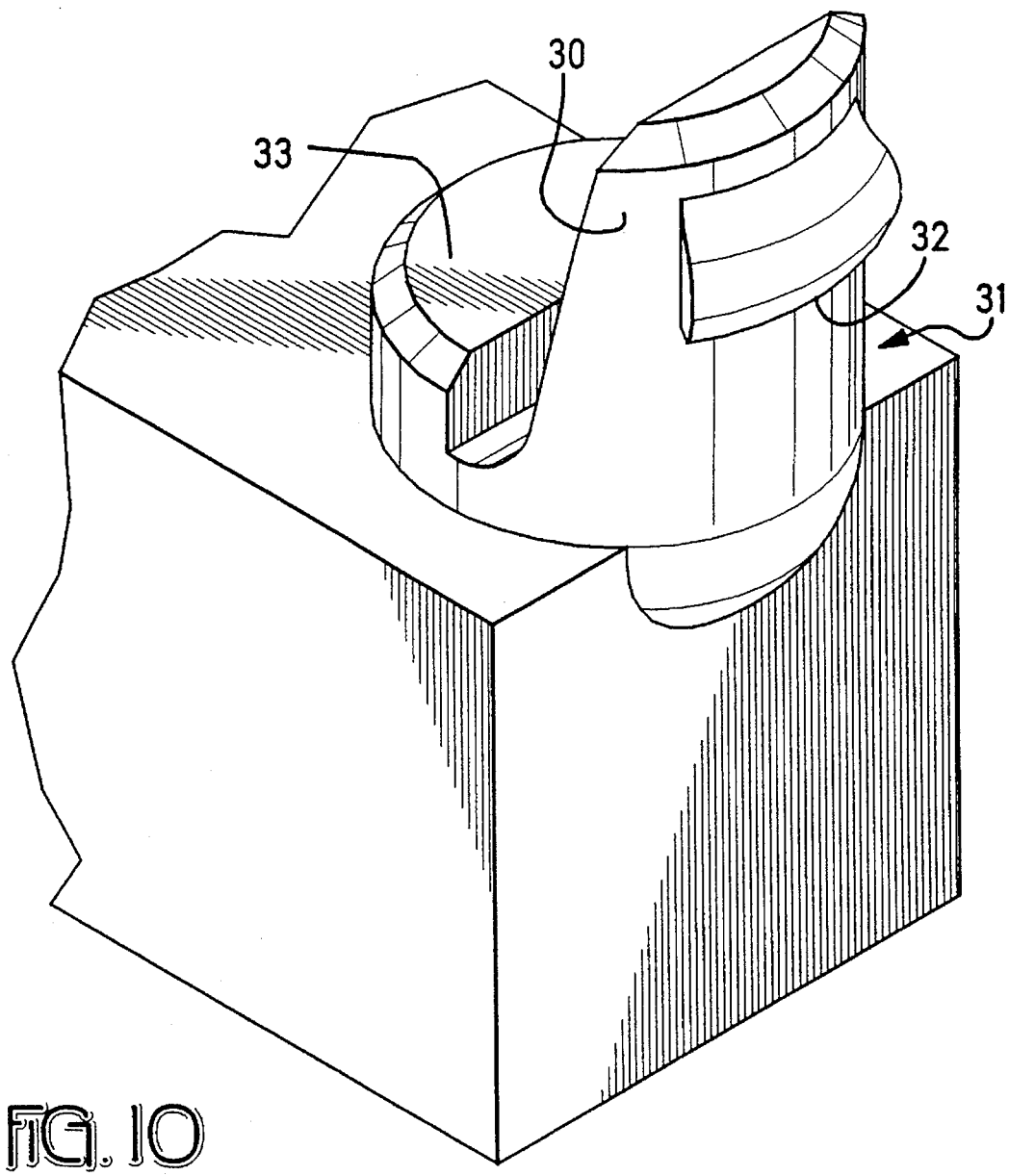
FIG. 10 is an isometric view of an alternate fastener.

FIG. 10 illustrates an alternate embodiment of the present invention in which a single tine 30 of projection 31 contains latch 32 latchingly engaging the remote surface of the PCB upon full insertion, as semicylindrical portion 33 is foreshortened, needing only to enter an aperture of the PCB for obtaining its alignment benefits. Preferably the single tine 30 extends far enough circumferentially to either side of latch 32 to engage inside surfaces of the recess of the opposite connector to engage and hold the recess end of the opposite connector in proper position against rotation about the opposite end, as seen in FIG. 3.

Many advantages are envisioned by the disclosed board-to-board sandwich connector. The fact that the connector sub-assemblies are identical requires a smaller inventory of parts. The board-to-board sandwich connector uses both sides of the PCB which saves board space. This feature is most important in view of the trend toward miniaturization. The sub-assemblies and printed circuit board are made to fit snugly for accurate positioning of the electrical contacts. The open recess is advantageous in allowing for easy access to the latching means for removing the sub-assembly from the PCB. The surface mount leads are flexible to accommodate any unevenness due to warping, etc., of the surface of the PCB and thereby allowing for the proper contact between the leads and the pads.

Obviously, many modifications may be made without departing from the basic spirit of the present invention. Accordingly, it will be appreciated by those skilled in the art that within the scope of the appended claims, the invention may be practiced other than has been specifically described herein.

What is claimed is:

1. A first electrical connector comprising:

an elongated main body portion provided with a front surface, a rear surface and a bottom surface, and at least one contact member carried through said elongated main body portion forming at least one surface mount lead projecting from said front surface and at least one contact section projecting from said rear surface to become electrically engaged with a corresponding conductive member of another electrical article;

the bottom surface of said elongated main body portion having one end provided with a first fastener and having another end provided with a first recess, said first fastener having a leading end being able to project through a first aperture at the edge of the top surface of a circuit board, said fastener including a slot extending from said leading end bifurcating said fastener and defining a pair of spaced tines at least one of which contains a first latch adjacent said leading end to latch onto the bottom surface of said circuit board, and said latch-containing tine being deflectable toward the other of said tines to permit insertion and withdrawal of said fastener through said first aperture; and said first recess being of such size and shape as to be able to receive that portion of a second fastener which projects through a second aperture at the edge of the bottom surface of said circuit board and projects over the top surface of said circuit board when said second fastener is affixed to the bottom surface of the circuit board.

2. The first electrical connector of claim 1 wherein multiple contact members are carried through said elongated main body portion.

3. The first electrical connector of claim 2 wherein the multiple electrical contact members form an array of regularly spaced electrical conductors.

4. The first electrical connector of claim 2 wherein a sufficient number and size of surface mount leads project from the front surface of said elongated main body portion to make contact with the required pads on the circuit board to which the electrical connector will be attached.

5. The first electrical connector of claim 1 wherein said first recess has an opening allowing for access to release a second latch on said second fastener received within said recess.

6. The first electrical connector of claim 1 wherein said recess extends to an end surface of said electrical connector to permit inward deflection of one tine of said second fastener toward another tine thereof spaced from and coextending along said one tine for release.

7. The first electrical connector of claim 1 wherein said first fastener is a projection integrally joined to said bottom surface of said main body portion.

8. The first electrical connector of claim 1 wherein said recess has an opening allowing for access to release a second latch on said second fastener received within said recess.

9. The first electrical connector of claim 4 latched and affixed to the edge of the top surface of said circuit board and wherein a second electrical connector configured substantially like the first electrical connector is inverted, reversed and affixed by said second fastener to the bottom surface of the circuit board through a second aperture at the edge of the bottom surface of said circuit board and latches onto the top surface of said circuit board, such that said first fastener and said second fastener projecting over top and bottom surfaces of said circuit board are received within a recess of its opposite electrical connector, and wherein said surface mount leads are soldered to pads on said circuit board and said contact sections angularly surround the edge of said circuit board in an alternately staggered relationship.

10. An electrical connector arrangement comprising a circuit board being provided with arrays of surface pads for the top surface and bottom surfaces of the PCB proximate to a selected edge, along which are a first aperture and second aperture each running from the top surface to the bottom surface; and joined to said printed circuit board are substantially identical first and second electrical connectors each comprising an elongated main body portion provided with a front surface, a rear surface, and a bottom surface, and with contact members being carried through said elongated main body portion forming surface mount leads projecting from said front surface and contact sections projecting from said rear surface for becoming electrically engaged with corresponding conductors of another electrical article;

the bottom surface of each elongated main body portion having one end provided with a fastener and the other end provided with a recess, said first electrical connector being affixed to the top surface of said circuit board by its fastener projecting through said first aperture of the top surface of said circuit board and latching onto the bottom surface of said circuit board to secure its electrical connector to the top of the circuit board; the recess of said first electrical connector being positioned over said second aperture of said circuit board;

said second electrical connector being inverted and reversed, and its fastener inserted from the bottom surface of said circuit board into said second aperture of the circuit board, the insertions of both electrical connectors being such that at least one latch on leading ends of each fastener latches onto an opposite surface of the circuit board; the recess on the bottom surface of each electrical connector receives that portion of the fastener projecting over the surface of the circuit board;

the surface mount leads projecting from said front surface of each electrical connector make contact with surface pads on the circuit board and are soldered to said pads, and the contact sections projecting from the rear surfaces of the first and second electrical connectors angularly surrounding the edge of said circuit board in an alternately staggered relationship.

11. The electrical connector arrangement of claim 10 wherein at least one said fastener is defined by a latch disposed on a leading end of a projection depending from said bottom surface to latch onto a surface of said circuit board, and wherein said fastener has but a single tine which contains said latch and is deflectable to permit insertion and withdrawal of said projection through said first aperture.

12. The electrical connector arrangement of claim 10 wherein each fastener is defined by a latch disposed on a leading end of a projection depending from said bottom surface to latch on to the bottom surface of said circuit board, and said projection includes a slot bisecting said projection from said leading end defining a pair of spaced tines at least one of which contains said latch and is deflectable toward the other to permit insertion and withdrawal of said projection from an aperture.

13. The electrical connector arrangement of claim 12 wherein said recess extends to an end surface of one said connector allowing access to said fastener of the other said connector received in said aperture of said one connector to permit inward deflection of one tine of said fastener toward the other tine thereof for release.

14. The electrical connector arrangement of claim 12 wherein said projection is integrally joined to said bottom surface of said main body portion.

15. The electrical connector arrangement of claim 10 wherein the recess on the bottom surface of each electrical connector has an opening allowing for access to said fastener received within said recess to facilitate delatching.

16. The electrical connector arrangement of claim 10 inserted into an electronic device.

* * * * *